United States Patent

[11] 3,617,944

[72] Inventors Akira Honda
Hachioji-shi;
Masao Kamimura, Kokubunji-shi, both of Japan
[21] Appl. No. 852,589
[22] Filed Aug. 25, 1969
[45] Patented Nov. 2, 1971
[73] Assignee Hitachi, Ltd.
Tokyo, Japan
[32] Priorities Aug. 26, 1968
[33] Japan
[31] 43/60478;
Aug. 26, 1968, Japan, No. 43/60478; Apr. 9, 1969, Japan, No. 44/26837

[54] MICROWAVE CIRCUIT DEVICE
6 Claims, 10 Drawing Figs.

[52] U.S. Cl. .......... 332/56, 331/9, 332/51
[51] Int. Cl. .......... H03c 1/08
[50] Field of Search .......... 307/320; 331/6, 9, 36 C, 117 V; 332/30 V, 51 W, 56

[56] References Cited
UNITED STATES PATENTS

| | | | |
|---|---|---|---|
| 2,905,902 | 9/1959 | Strandberg | 331/9 |
| 3,139,592 | 6/1964 | Sisson | 331/9 X |
| 3,465,265 | 9/1969 | Kuru | 307/320 X |
| 3,509,499 | 4/1970 | Schaffner | 333/83 |

*Primary Examiner*—Roy Lake
*Assistant Examiner*—Lawrence J. Dahl
*Attorney*—Craig, Antonelli, Stewart and Hill

ABSTRACT: A microwave circuit device composed principally of a solid state oscillator and a reaction type cavity resonator, constructed so as to develop a microwave output through a phase shifter and the above-mentioned reaction type cavity resonator at the output side of the above-mentioned solid state oscillator, and adapted to develop an oscillation output or modulated signal output suppressing noise generated in the solid state oscillator.

MICROWAVE CIRCUIT DEVICE

BACKGROUND OF THE INVENTION

1. Field of the Invention

The present invention relates to a microwave circuit device including a microwave solid state oscillator especially composed of a solid state element, a waveguide, etc., and a device to change the oscillation frequency by means of an external driving signal, e.g. a frequency modulation device, an amplitude modulation device or an automatic frequency control device.

2. Description of the Prior Art

A microwave solid state oscillator has advantages over a thermionic tube oscillator such as a conventional klystron oscillator, namely, smallness of size, lower power consumption and also higher reliability can be expected. Whereas, generally it has disadvantages such as a higher noise level and an inferior spectrum purity. Hence, there are left many problems to be solved before applying solid state oscillators to microwave circuits which require the transmission of signals of superior quality.

Conventionally, there is a circuit device which utilizes injection locking for the purpose of covering up the above-mentioned disadvantages of a solid state oscillator. This utilizes the creation of what is called a "locking effect" wherein a vibration phenomena including an oscillation phenomenon is pulled into another vibration phenomenon under a specified condition. More precisely, it utilizes the locking effect for frequency stabilization and the reduction of noise components in an oscillation within a microwave band. However, this method has an economical drawback because it requires another extra oscillator of high stability in order to stabilize the output of the main oscillator. Also, there is another method which makes use of what is called "self injection locking." By this method it is necessary to pick up a portion of the output of the main oscillator itself, to apply a phase adjustment or the like thereto, and thereafter to inject it again into the main oscillator. With this method, when the circuit is constructed as what is called a microwave circuit, a phase-adjusted signal is injected through a resonator and a circulator from the output side of the oscillator. In general, the effect of injection locking is proportional to the Q value of the resonator and the injection power, and particularly when the Q value of the resonator exceeds a certain value, the influence of the injection power level becomes predominant. Accordingly, it is desirable to increase the coupling factor of a coupler employed, whereas, if it is increased, the power obtainable at the output side is reduced. Furthermore, technical problems are apt to be caused by the use of a circulator, because it has drawbacks due to its insertion loss and its temperature characteristic. Moreover, in the case where a modulator is constructed employing a conventional solid state oscillator as described hereinbefore, disadvantages, such as complication of the modulation arrangement, increase in noise and so on, are unavoidable.

SUMMARY OF THE INVENTION

One object of the present invention is to provide a microwave circuit device by employing a new construction, which device is free from the disadvantages of the oscillator constructed with the aforesaid conventional solid state oscillation element, the modulator, etc., to reduce the noise of a microwave solid state oscillator, to stabilize the frequency thereof, and further to miniaturize the solid state oscillation circuit device.

Another object of the present invention is to provide a microwave modulator which is stable and has a satisfactory low noise characteristic by means of the above-mentioned solid state oscillation circuit device. The present invention will be described in detail in conjunction with the drawings hereunder.

DESCRIPTION OF THE PREFERRED EMBODIMENTS

Figure 1:
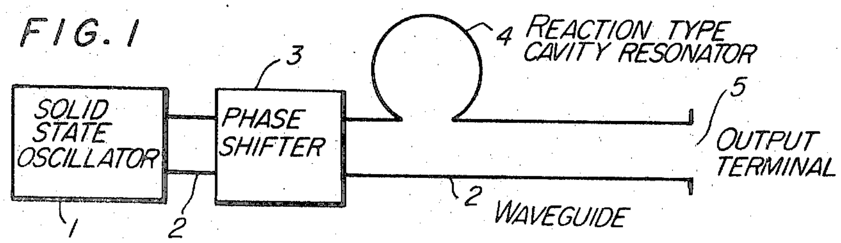
FIGS. 1 and 2 are both schematic diagrams showing the embodiments of circuit devices according to the present invention.

FIG. 1 is a fundamental diagram showing the microwave solid state oscillation circuit device according to the present invention.

As shown in FIG. 1, the microwave oscillation circuit device according to the present invention is composed of a solid state oscillator 1, a waveguide 2, a phase shifter 3, a reaction type cavity resonator 4 and an output terminal 5. The operation of the above-mentioned circuit is such that the high-frequency oscillation output of the solid-state oscillator 1 reaches the resonator 4 through the phase shifter 3, which resonator 4 functions to increase the attenuation within a specified frequency range whose center is the resonant frequency of said resonator 4. In the case where the resonant frequency of the resonator 4 is approximately equal to the oscillation frequency of the solid state oscillator 1, a portion of the output of the solid state oscillator is reflected by the resonator 4 and returned toward the solid state oscillator to be applied thereto. Hereupon, if the phase of the above-mentioned reflected and returned signal is suitably adjusted by varying the phase shifter, a locking phenomenon occurs. This phenomenon is caused by the discrimination effect of the resonator 4 and the self induced automatic frequency control (AFC) effect due to the self detection of the solid state oscillator 1. This functions to remarkably decrease the FM-type noise in the vicinity of the oscillation frequency. As is apparent from FIG. 1, the device according to the present invention is simple in construction and small in size, furthermore, it is able to produce a large injection signal easily. Furthermore, the microwave solid-state oscillator provided with the device according to the present invention has the AFC function and operates at a frequency to be determined by the external resonator as stated hereinbefore, hence, by forming the resonator with materials having low-temperature coefficients, it can provide the advantage of being made quite sturdy and stable against ambient conditions.

The results obtained from a simple experiment will be described hereinbelow.

When an avalanche diode oscillator having a frequency of 9.4 GHz. and an output of 50 mw. was connected with a resonator of $Q_L$ having a approximately 6000 and a dip of 30 percent and also with a phase shifter, the FM-type noise thereof in the vicinity of its oscillation frequency could be made substantially the same as that of a klystron 2K25. The fundamental wave output was increased by 20 percent (shown by the measured value of approximately 0.8 db.)

Figure 2:
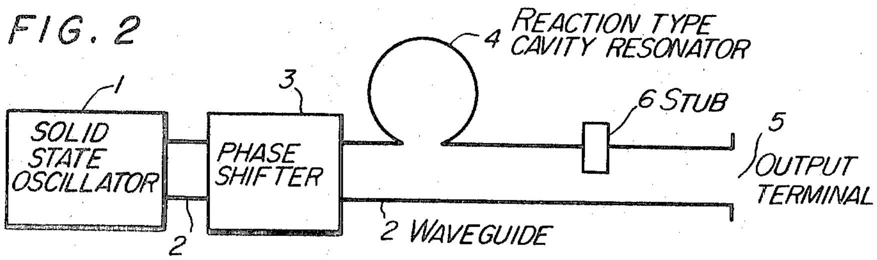

FIG. 2 shows the schematic drawing of another solid state oscillation circuit device embodying the present invention, which has been further improved over the circuit device described above. Namely, when the noise of an oscillator is reduced by the self injection locking method, the effect is increased in proportion to the load Q value of the resonator inserted in the circuit and the injection power injected into the oscillator. However, this gives rise to problems in constructing the circuit, further, technical and economical problems to enlarge the effect by increasing the load Q value of the resonator. This embodiment is adapted to increase the equivalent amount of dip thereby increasing the injection power without decreasing the load Q value of the resonator. That is, as shown in FIG. 2, a stub adjuster 6 has been provided between the resonator 4 and the output terminal 5, whose depth of insertion and position of insertion are properly determined, thereby increasing the power capable of being injected into the oscillator. In FIG. 2, numerals 1 to 5 designate elements having the same functions as those of the elements designated with the same numerals in FIG. 1. Namely, 1 designates a solid-state oscillator, 3 a phase shifter, 4 a reaction-type cavity resonator, and 5 the output terminal. The resonator 4 is a resonator for generating an injection signal, and the signal reflected in the resonator is adjusted in its phase by the phase shifter 3 and applied to the oscillator 1, thereby bringing the oscillator 1 into a self locking state so that the output thereof may be stabilized and simultaneously the noise in the vicinity of its oscillation frequency may be reduced. At that time, the stub adjuster 6 is made to reflect a portion of the output toward the side of the oscillator, and the reflection point is adjusted to be set at a proper position. Then, if the reflected wave returning to the oscillator 1 is adjusted in its phase, the reflected power applied to the oscillator is composed of the reflected power from the resonator 4 and that from the stub adjuster 6 superposed on each other, thereby increasing the injection charge, enhancing the self-locking operation and increasing its effect. As a result, noise can be further reduced, and the pull-in range of the resonator 4 is also further extended.

Figure 3A:
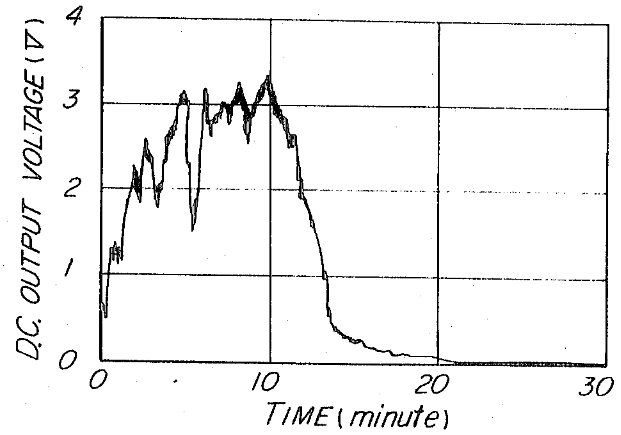
FIGS. 3*a* and 3*b* show respectively actual measurement diagrams of the noise characteristics after switching-on for a conventional solid state oscillation device and an embodiment of the present invention.
Figure 3B:
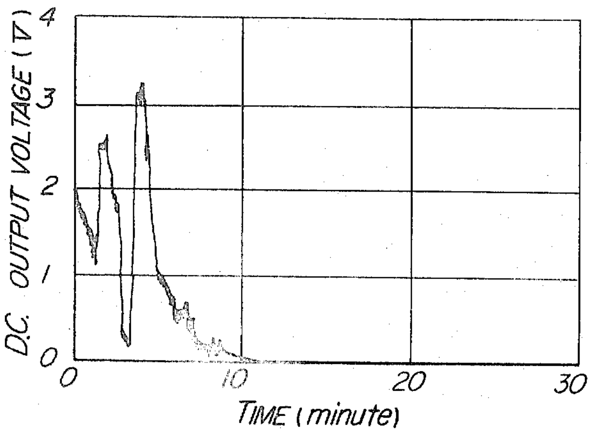

In an experiment employing the aforesaid structure, an avalanche diode oscillator made by Sylvania (SYA-3200B), whose output was 50 mw. and oscillation frequency 9.4 GHz., was employed as the solid-state oscillator 1, and a reaction type cavity resonator, whose $Q_L$ was 1,500 and dip 30 percent, was externally attached. As a result, the above-mentioned noise level by the structure shown in FIG. 1 has proved to be lower than the one with no injection locking by 20 to 30 dB. With the structure shown in FIG. 2, namely when a stub adjuster has been employed, the noise level has been further reduced and is shown by experiment to be the same as or lower than the noise level of an ordinary klystron oscillator. The above description has been given of a comparison between the noise levels of both oscillation devices in their steady states, a conventional one and the one according to the present invention. In general, a microwave oscillation device requires a considerable time until its operation settles down to a steady state, thereby causing inconvenience in practical use. That is, immediately after a power supply switch is closed, there generally results an extremely large noise output. The present invention has the advantage that the time required to reach a steady state and the noise level can be remarkably reduced. FIGS. 3*a* and 3*b* show the measured results of noise outputs just after closing the power supply switches for both solid state oscillation devices, a conventional one and a device according to the present invention respectively. It is seen from these figures that the time required to reach a steady state and the noise output, have been extremely reduced in the present inventive device.

Figure 4:
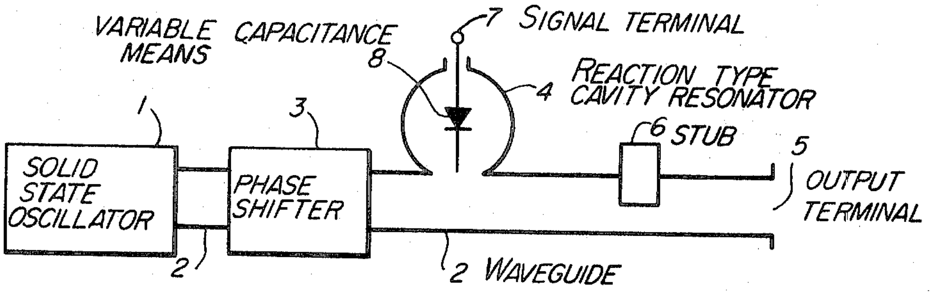
FIG. 4 is a schematic diagram showing the construction of another embodiment of the present invention.

FIG. 4 is a schematic structural drawing showing another embodiment of the present invention. The fact that the output frequency of the oscillation device is sensitive to the influence of the reaction type cavity resonator 4, as stated hereinbefore, is utilized to obtain a device wherein the oscillation frequency can be changed by means of an external signal, for example, an AFC device, a frequency modulation device or the like. In FIG. 4, numerals 1 to 3 and 5 to 6 designate elements having the same functions and constructions as those of the elements designated identically in FIG. 2, so the descriptions thereof will be omitted. The device has a construction such that, in order to change the resonant frequency of a reaction type cavity resonator 4, an element 8 which electrically changes the resonant frequency of the resonator 4, for example a varactor diode, or means 8 whereby the resonant frequency of the resonator is mechanically changed is provided, and that an external signal is applied to said means 8 from a signal input terminal 7.

In the above-described construction, as will be stated later, the frequency of the oscillator is remarkably influenced by the resonant frequency of the resonator 4 provided at the output portion of the oscillation device, hence, if an electrical or a mechanical driving signal is applied to the cavity resonator 4 from the external signal input terminal 7, a microwave signal proportional to the driving signal can be taken out from the output terminal 5 of the oscillation device. When frequency modulation is to be effected with a comparatively high-frequency signal such as a video, audio or the like signal, in changing the frequency of the resonator 4, a semiconductor variable capacitance element (generally called a varactor) or the like can be arranged in the resonator 4 thereby to effect frequency modulation. In applying the present invention to an automatic frequency control device, a sweep signal generator or the like which changes its frequency comparatively slowly can be used so that the resonant frequency of the resonator can be changed mechanically.

Figure 5:
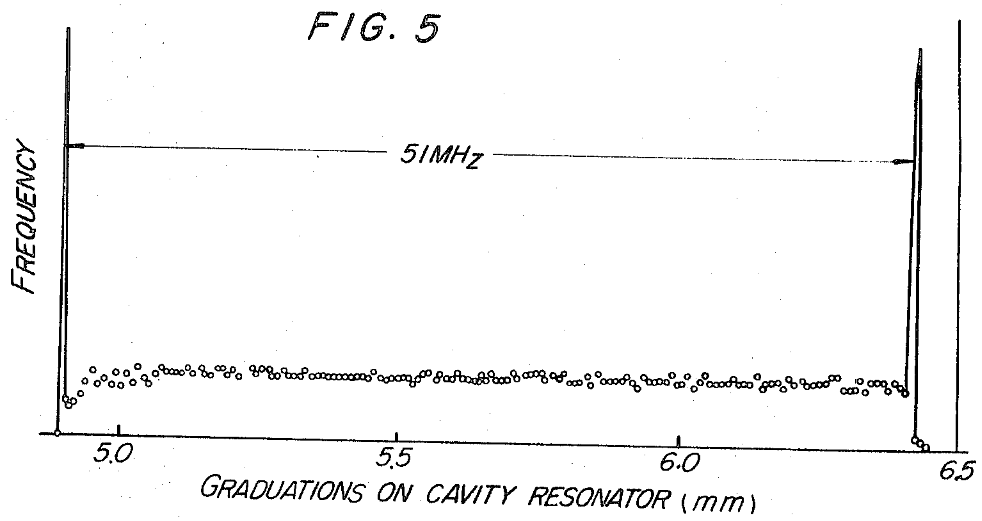
FIG. 5 is a characteristic diagram showing the experimental result of the above embodiment shown in FIG. 4.

FIG. 5 shows the experimental results of the embodiment shown in FIG. 4 explained above. In FIG. 5, the abscissa indicates graduations on a mechanical device to change the resonant frequency of the resonator, and the ordinate shows the measured result at the output terminal of the device shown in FIG. 4. More precisely, FIG. 5 shows the change in the graduation reading of a wavemeter versus every 1/100 mm. change in the graduation reading on the frequency changing device of the load resonator. In addition, in the above experiment, the $Q_L$ value of the resonator was 1,150, the dip 30 percent, and the center frequency of the oscillator 9.4 GHz. It is seen from the above experiment that the frequency change is completely proportional to the mechanical change within a specified frequency band (50 MHz.). In the above experimental example, the resonant frequency of the cavity resonator was made to be changed mechanically, however, the oscillation frequency of the device may be changed all the same, if a variable capacitance element is arranged in the above cavity resonator and applied by an external signal which has been converted into a voltage. Consequently, the present invention can give remarkably useful means to a frequency modulation device or an automatic frequency control (AFC) device, especially to a local oscillator device in a receiver system which requires an AFC operation. That is to say, by suitably adjusting the electrical length between the oscillator 1 and the resonator 4 in FIG. 4 by means of the phase shifter 3 or the like, the discrimination effect of the resonator remarkably reduces the FM-type noise generated in the vicinity of the required oscillation frequency, it functions to stabilize the oscillation frequency, and makes possible a change of 1 to 3 percent in the frequency of the oscillator without increasing the noise level as stated above. Therefore, the above-described advantages are particularly effective in the construction of a local oscillation device which requires an AFC operation.

Figure 6:
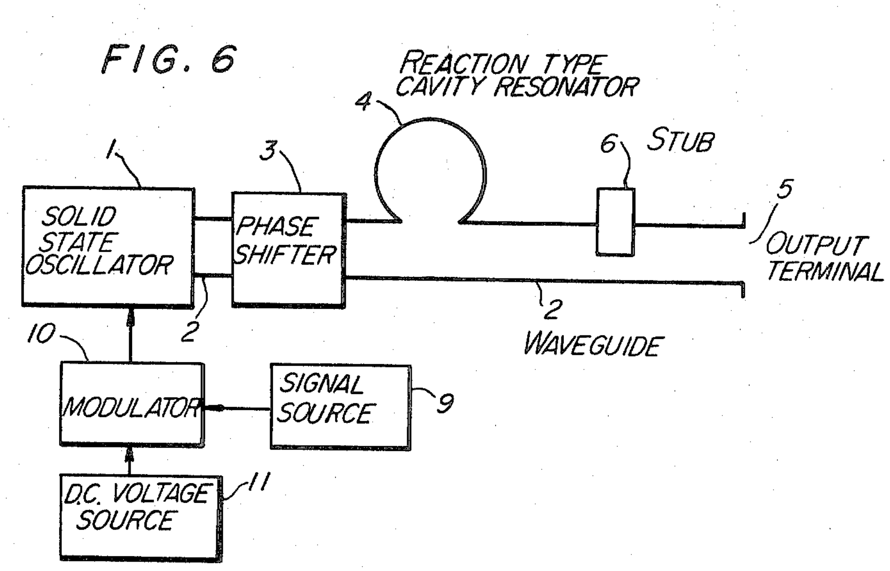
FIG. 6 is a schematic diagram showing the construction of another embodiment of the present invention.

FIG. 6 is a schematic structural drawing showing another embodiment of the present invention. This embodiment constitutes a high frequency amplitude modulator modulator wherein a signal voltage is superposed on the bias of a solid-state oscillator 1 thereby to effect the amplitude modulation. In FIG. 6, numerals 1 to 6 designate the same elements as those identically designated in FIG. 2. Numeral 1 designates a solid state oscillator, 2 a waveguide, 3 a phase shifter, 4 a reaction type cavity resonator, 5 an output terminal, and 6 a stub. Numeral 11 designates a DC voltage source, which feeds a modulator 10. Numeral 9 designates a source of a modulation signal such as a voice signal or the like, which modulation signal is superposed on a DC voltage in the modulator 10 and is then applied to the solid-state oscillator as the bias voltage thereof.

In general, when a direct amplitude modulation is effected by superposing a modulation signal on the bias voltage of a solid state oscillator, frequency modulation FM components are simultaneously generated to function as noise, thereby causing difficulty in obtaining a modulated signal of good quality. However, the present invention can provide a high-frequency amplitude modulator free from this FM-type noise.

Figure 7:
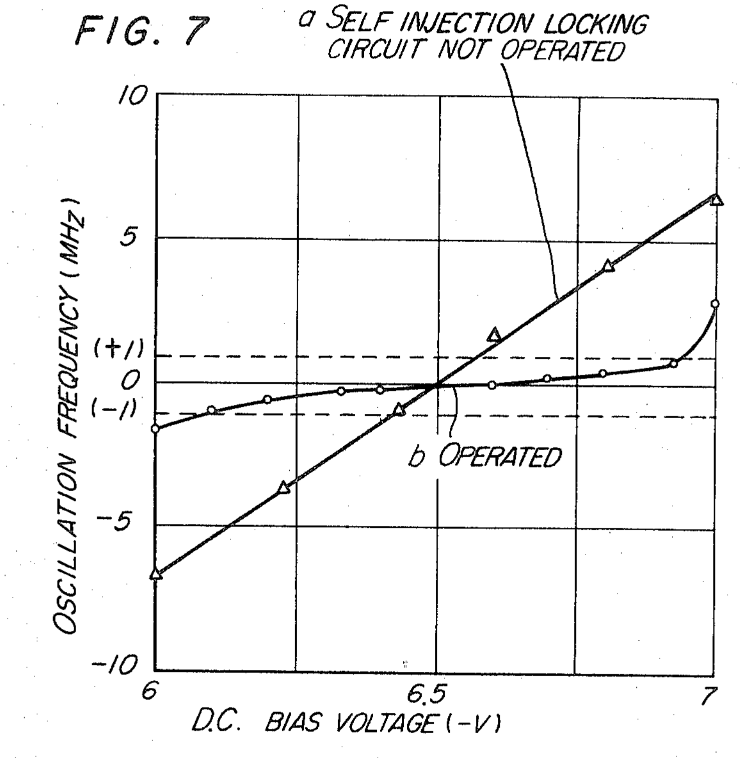
FIGS. 7, 8*a* and 8*b* are respectively characteristic diagrams showing the experimental results of the above embodiment shown in FIG. 6.

In the construction stated above, in a modulation signal is not applied to the solid state oscillator, namely when the bias voltage of the solid state oscillator is constant, on account of the self injection locking effect as described hereinbefore, the oscillation frequency of the output obtained at the output terminal 5 is normally equal to the resonant frequency of the reaction type cavity resonator 4, and even if the frequency of the oscillator 1 should be varied due to ambient conditions or the like, or even under the existence of unnecessary FM components, the frequency variation is completely suppressed. FIG. 7 shows an example of the experimental results of the suppression effect. In the experiment, a Gunn diode was employed as the solid-state oscillator. In FIG. 7, the abscissa indicates the DC bias voltage of the diode, and the ordinate indicates the oscillation frequency deviation (the reference frequency has been taken at the one when the bias voltage is 6.5 v.). In the characteristic diagram, curve "*a*" indicates the variation in the oscillation frequency when the self injection locking circuit is not operated, namely, that of the Gunn diode oscillator itself, curve "*b*" indicates the variation in the output frequency when the self injection locking circuit is in operation, namely, the one at the output terminal in FIG. 1. As is apparent from the experimental results, the frequency variation of ±5[MHz.] has been suppressed within ±1[MHz.].

Figure 8A:
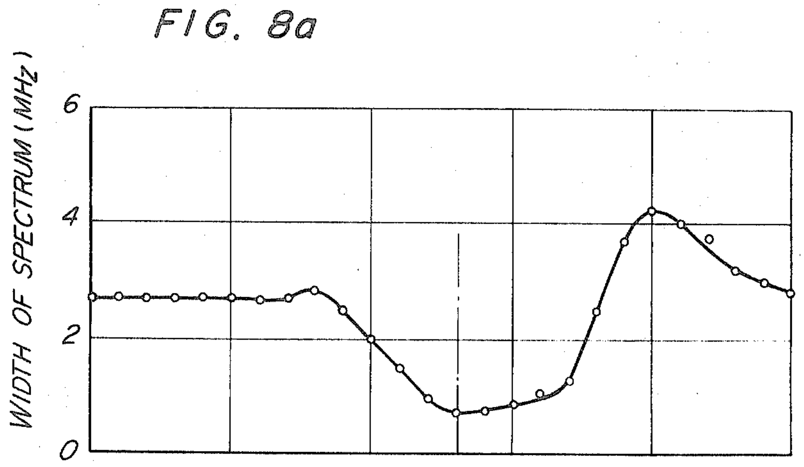
Figure 8B:
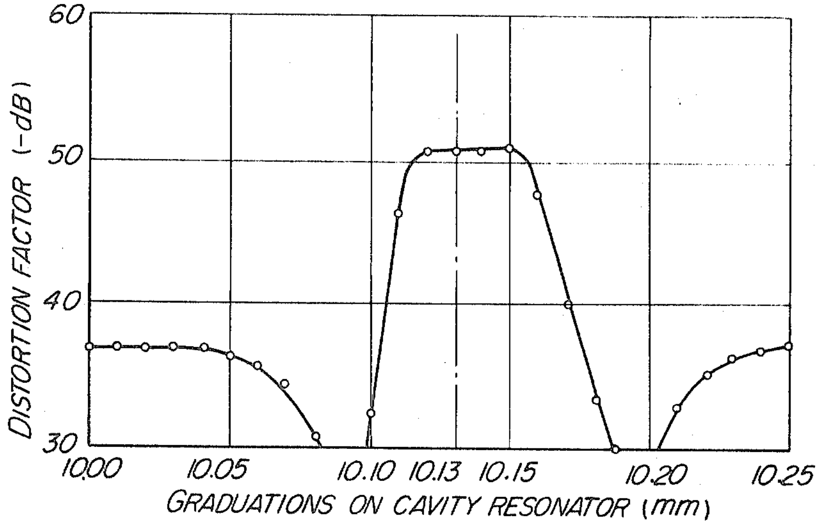

FIGS. 8*a* and 8*b* show measured results of the distortion factor of a demodulated waveform and the band width of the oscillation frequency spectrum (unnecessary FM components), either of a modulated signal in the embodiment of the present invention having the structure as shown in FIG. 6. More precisely, the results were obtained by measuring the distortion factor and the width of the oscillation frequency spectrum of a demodulated waveform when the resonant frequency of the cavity resonator 4 in the injection circuit was changed while the modulator 10 was supplied with a sine wave having a constant amplitude and a constant frequency as a modulation signal 9 in FIG. 6. It can be proved by these measured results that, within a specified frequency range, unnecessary FM components (the width of the oscillation frequency spectrum) are remarkably reduced and the distortion factor is greatly lowered. In FIGS. 8*a* and 8*b*, the abscissa indicates mechanical graduations on the cavity resonator 4 in the injection circuit. At the point on the abscissa where the graduation is 10.13, the resonant frequency of the cavity resonator 4 coincides with the oscillation frequency of the solid-state oscillator 1, while, in the regions under the graduation 10.05 and over the graduation 10.25, the resonant frequency of the cavity resonator deviates from the oscillation frequency of the solid-state oscillator 1, thereby providing no influence by the cavity resonator.

In the embodiments as described hereinbefore, it can be made possible with a simple structure to suppress the FM components which are inevitable in an amplitude modulation which is effected by superposing a modulation signal on the bias voltage of a solid-state oscillator, thereby obtaining an amplitude modulated signal of good quality.

The present invention has been described hereinbefore in connection with some embodiments thereof. Even when an element which is apt to generate noise, such as a solid-state oscillator, is employed as a microwave oscillation circuit element, the microwave circuit device according to the present invention is able to stabilize its frequency as well as to suppress noise therein by means of a simple structure employing only a reaction-type resonator.

We claim:

1. A microwave circuit device comprising a solid state oscillator for generating a microwave signal, a waveguide for taking out the oscillation output of said oscillator, a reaction type cavity resonator arranged at a predetermined position on said waveguide and having a resonant frequency substantially equal to the oscillation frequency of said oscillator, and a phase shifter positioned in said waveguide between said oscillator and said cavity resonator, the position of said resonator on said waveguide being located where said resonator reflects a portion of the output of said oscillator toward said oscillator and the phase shifter adjusts the phase of said reflected signal thereby effecting a self injection locking effect on said oscillator.

2. A microwave circuit device as defined in claim 1 wherein said reaction-type cavity resonator is provided with means for changing the resonant frequency thereof in response to an external signal applied thereto.

3. A microwave circuit device as defined in claim 1 wherein a modulation signal is superposed on a bias voltage source of said oscillator thereby effecting an amplitude modulation.

4. A microwave circuit device as defined in claim 1 wherein adjustable means for enhancing the self injection locking operation are provided at a proper position between said cavity resonator on said waveguide and an output terminal of said waveguide.

5. A microwave circuit device as defined in claim 4 wherein said reaction type cavity resonator is provided with means for changing the resonant frequency thereof with an external signal applied thereto.

6. A microwave circuit device as defined in claim 4 wherein a modulation signal is superposed on a bias voltage source of said oscillator thereby effecting an amplitude modulation.

* * * * *